(12) United States Patent
Yan (10) Patent No.: US 11,825,641 B2
(45) Date of Patent: Nov. 21, 2023

(54) PATTERN LAYOUT AND THE FORMING METHOD THEREOF

(71) Applicant: Fujian Jinhua Integrated Circuit Co., Ltd., Quanzhou (CN)

(72) Inventor: Yifei Yan, Fujian (CN)

(73) Assignee: Fujian Jinhua Integrated Circuit Co., Ltd.

( * ) Notice: Subject to any disclaimer, the term of this patent is extended or adjusted under 35 U.S.C. 154(b) by 94 days.

(21) Appl. No.: 17/306,963

(22) Filed: May 4, 2021

(65) Prior Publication Data

US 2022/0130828 A1 Apr. 28, 2022

(30) Foreign Application Priority Data

Oct. 23, 2020 (CN) .......................... 202011150332.X (51) Int. Cl.
| | | |
|---|---|---|
| *G03F 1/36* | (2012.01) | |
| *H10B 12/00* | (2023.01) | |
| *G06F 30/392* | (2020.01) | |
| *H01L 23/528* | (2006.01) | |
| *G03F 7/00* | (2006.01) | |

(52) U.S. Cl.
CPC .............. *H10B 12/00* (2023.02); *G03F 1/36* (2013.01); *G03F 7/70441* (2013.01); *G06F 30/392* (2020.01); *H01L 23/528* (2013.01)

(58) Field of Classification Search
CPC ......... H10B 12/05; H10B 12/053; G03F 1/36; G03F 7/70425; G03F 7/70433; G03F 7/70441
See application file for complete search history.

(56) References Cited

U.S. PATENT DOCUMENTS

| | | | | |
|---|---|---|---|---|
| 7,681,171 B2* | 3/2010 | Chen | ...................... | G06F 30/398 430/30 |
| 2002/0005542 A1* | 1/2002 | Hayano | .............. | H10B 12/0335 257/E21.507 |
| 2002/0006734 A1* | 1/2002 | Imai | .................... | G03F 7/70283 257/E21.018 |
| 2005/0003278 A1* | 1/2005 | Hwang | ..................... | G03F 1/36 430/323 |
| 2007/0248893 A1* | 10/2007 | Kang | ........................ | G03F 1/68 430/30 |

* cited by examiner

*Primary Examiner* — Phat X Cao
*Assistant Examiner* — William Henry Anderson
(74) *Attorney, Agent, or Firm* — Winston Hsu (57) ABSTRACT

The invention discloses a pattern layout of an active region and a forming method thereof. The feature of the present invention is that in the sub-pattern unit, an appropriate active area pattern is designed according to the bit line pitch (BLP) and the word line pitch (WLP), the active area pattern is a stepped pattern formed by connecting a plurality of rectangular patterns in series, and the active area pattern is arranged along a first direction, the angle between the first direction and the horizontal direction is A. In addition, according to the angle A, the shortest distance (P) between adjacent stepped patterns, the length and width of sub-pattern units, etc., The positions of some stepped active area patterns are adjusted, so that the distance between multiple active area patterns can be consistent when being repeatedly arranged, thereby improving the uniformity of overall pattern distribution.

8 Claims, 6 Drawing Sheets

PATTERN LAYOUT AND THE FORMING METHOD THEREOF

BACKGROUND OF THE INVENTION

1. Field of the Invention

The invention relates to the field of semiconductors, in particular to a pattern layout of an active region and a forming method thereof, which are beneficial to improving the arrangement uniformity of the whole pattern.

2. Description of the Prior Art

In recent years, the design of electronic products generally has multi-function and fast processing ability. In order to increase the processing capacity, for example, computer systems or multi-functional electronic products need large-capacity dynamic random access memory (DRAM). In order to improve the memory capacity, the size of the memory cell needs to be reduced, but the large reduction of the size of the memory cell will lead to other problems, which will make the operation of the memory cell unstable or damaged.

Semiconductor components are generally based on the active layer units defined on the substrate, and the desired component structure is formed upwards. Therefore, the active layer unit on the substrate is the basis of the component, which will determine the size, shape and position of the component. The active layer unit is also referred to as a component unit hereinafter.

Taking a memory cell of a memory as an example, a plurality of component cells will form an array in a regular arrangement in a predetermined component area. A component unit will eventually form a memory unit. In addition, in order to operate these memory cells, there are some peripheral circuits around the memory cells to control these memory cells. These peripheral circuits are also formed on the basis of peripheral active areas.

Therefore, under the demand of greatly reducing the size of semiconductor devices, how to design the device structure to maintain the normal operation of the devices is also one of the topics to be considered.

SUMMARY OF THE INVENTION

The invention provides a pattern layout, which comprises a plurality of first line segments which are mutually parallel and arranged separately along a horizontal direction and a plurality of second line segments which are mutually parallel and arranged separately along a vertical direction, wherein BLP is defined as the upper boundary edge of any first line segment to another adjacent first line segment, and WLP is defined as the left boundary edge of any second line segment to another adjacent second line segment, Wherein any one of the first line segments and any one of the second line segments have the same length and width, and the first line segment and the second line segment are in direct contact with each other, and the sub-pattern unit has a width of 4WLP and a length of 4BLP, and a plurality of oblique stepped patterns, wherein each oblique stepped pattern comprises a plurality of rectangular patterns connected with each other and arranged along a first direction, a width of each rectangular pattern in the horizontal direction is defined as X, and a part of each rectangular pattern which does not overlap with the adjacent rectangular pattern in the vertical direction is defined as Y, and the following conditions are met: BLP/3WLP=Y/X, wherein N oblique stepped patterns are located in the sub-pattern unit, and the conditions are met: (4BLP+C*Y)/N=integer, wherein C is 0 or the smallest positive integer greater than or equal to 1, and in which n is an integer.

The invention provides a method for forming a pattern layout, which comprises forming a plurality of first line segments arranged parallel to each other along a horizontal direction and forming a plurality of second line segments arranged parallel to each other along a vertical direction, wherein BLP is defined from the upper boundary edge of any first line segment to the upper boundary edge of another adjacent first line segment, WLP is defined from the left boundary edge of any second line segment to the left boundary edge of another adjacent second line segment, The sub-pattern unit has a width of 4WLP and a length of 4BLP, forming a plurality of oblique stepped patterns, wherein each oblique stepped pattern comprises a plurality of rectangular patterns connected with each other and arranged along a first direction, wherein a width of each rectangular pattern in the horizontal direction is defined as X, and a part of each rectangular pattern which does not overlap with the adjacent rectangular pattern in the vertical direction is defined as Y, and the following conditions are met: BLP/3WLP=Y/X, a total of N oblique stepped patterns are located in the sub-pattern unit, and satisfy the condition that (4BLP+C*Y)/N=integer, where C is 0 or the smallest positive integer greater than or equal to 1, and n is an integer.

The invention provides a pattern layout, which is characterized in that a plurality of oblique stepped patterns are arranged in parallel with each other, wherein each oblique stepped pattern is formed by repeatedly arranging a plurality of rectangular patterns with the same size, wherein each oblique stepped pattern comprises a plurality of rectangular patterns with the same size which are connected with each other and arranged along a first direction, wherein a width of each rectangular pattern with the same size in a horizontal direction is defined as X, and a part of each rectangular pattern which does not overlap with an adjacent rectangular pattern in the vertical direction is defined as Y, wherein Y is not equal to 0.

The feature of the present invention is that in the sub-pattern unit, an appropriate active area pattern is designed according to the bit line pitch (BLP) and the word line pitch (WLP), wherein the active area pattern is a stepped pattern formed by connecting a plurality of rectangular patterns in series, and the active area pattern is arranged along a first direction, wherein the angle between the first direction and the horizontal direction is A. In addition, according to the angle A, the shortest distance (P) between adjacent stepped patterns, the length and width of sub-pattern units, the positions of some stepped active area patterns are adjusted, so that the distance between multiple active area patterns can be consistent when being repeatedly arranged, thereby improving the uniformity of overall pattern distribution.

These and other objectives of the present invention will no doubt become obvious to those of ordinary skill in the art after reading the following detailed description of the preferred embodiment that is illustrated in the various figures and drawings.

DETAILED DESCRIPTION

The following detailed description refers to the contents shown in the relevant drawings, which is used to illustrate the embodiments that can be implemented according to the present invention. These examples have provided enough details to enable those skilled in the art to fully understand and practice the present invention. Within the scope of the present invention, structural or electrical modifications can still be made and applied to other embodiments.

Figure 1:
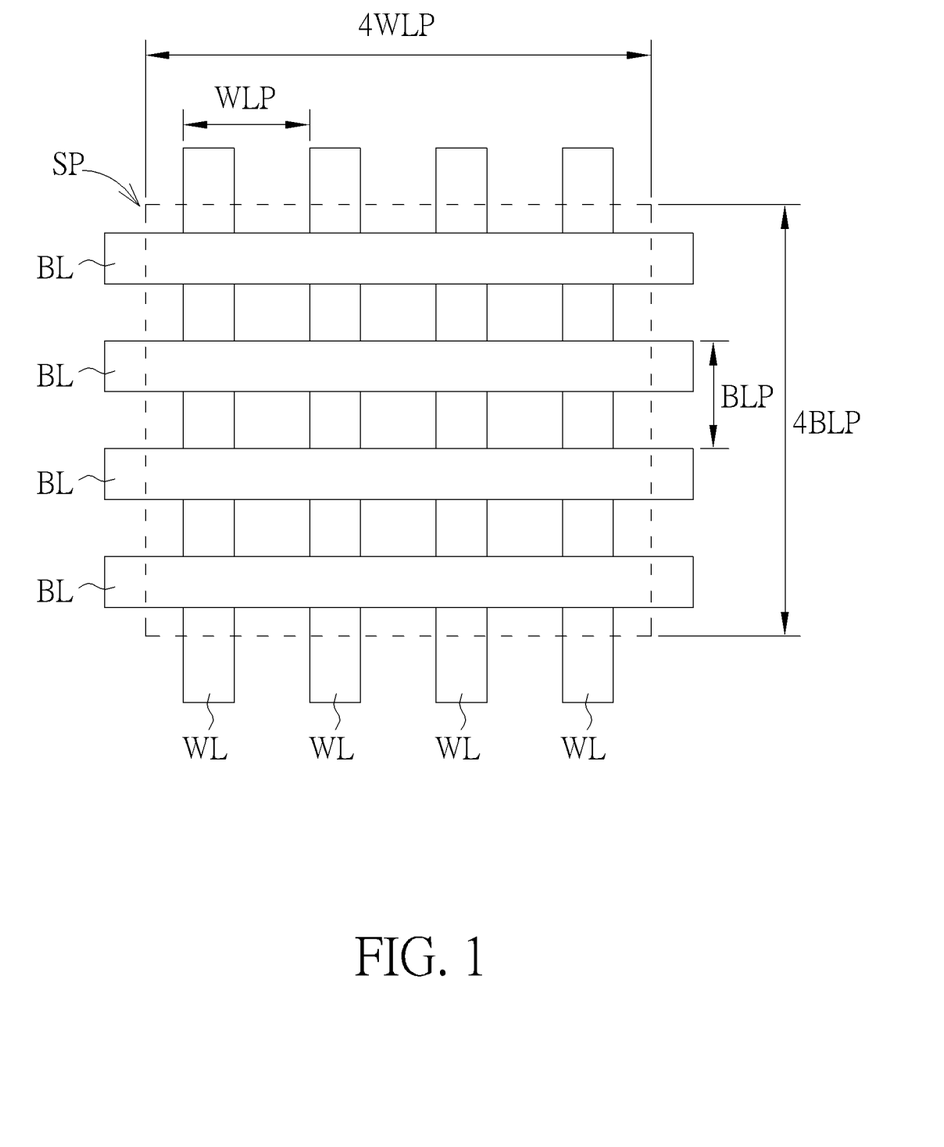
FIG. 1 shows a schematic diagram of a sub-pattern unit, wherein the sub-pattern unit includes four first line segments arranged along the horizontal direction and four second line segments arranged along the vertical direction.

FIG. 1 shows a schematic diagram of a sub-pattern unit SP, wherein the sub-pattern unit SP includes a plurality of first line segments arranged parallel to each other along a horizontal direction and a plurality of second line segments arranged parallel to each other along a vertical direction, for example, four bit lines (BL) (first line segments) arranged along the horizontal direction and four word lines (WL) (second line segments) arranged along the vertical direction. In this embodiment, a sub-pattern (SP) is the smallest unit of a memory, and the smallest unit can replicate the extended distribution many times, for example, it is repeatedly arranged to form an array-like rectangular memory array on the substrate. To calculate the area of each sub-pattern unit SP conveniently, in this embodiment, one sub-pattern unit SP includes four bit lines (BL) arranged parallel to each other along the horizontal direction (X axis) and four word lines (WL) arranged along the vertical direction (Y axis). The distance between an upper boundary of any bit line and an upper boundary of another adjacent bit line is defined as BLP (bit line pitch). Similarly, the distance from the lower boundary of any bit line to the lower boundary of another adjacent bit line is also BLP, and the distance from a left boundary of any word line to a left boundary of another adjacent word line is defined as WLP (word line pitch). Similarly, the distance from a right boundary of any word line to a right boundary of another adjacent word line is also WLP. Either the distance BLP or the distance WLP described here is affected by the exposure critical dimension (CD) of the lithography process. In this embodiment, for example, the distance WLP is 52 nanometers (nm), and the distance BLP is 62 nanometers. The length and width of a sub-pattern unit SP are 4BLP and 4WLP, respectively (as shown by the dotted line in FIG. 1). It is worth noting that the distance WLP of 52 nm and the distance BLP of 62 nm mentioned in this embodiment are only one example of the present invention, which is not limited by the present invention, and these values can be adjusted.

Figure 2:
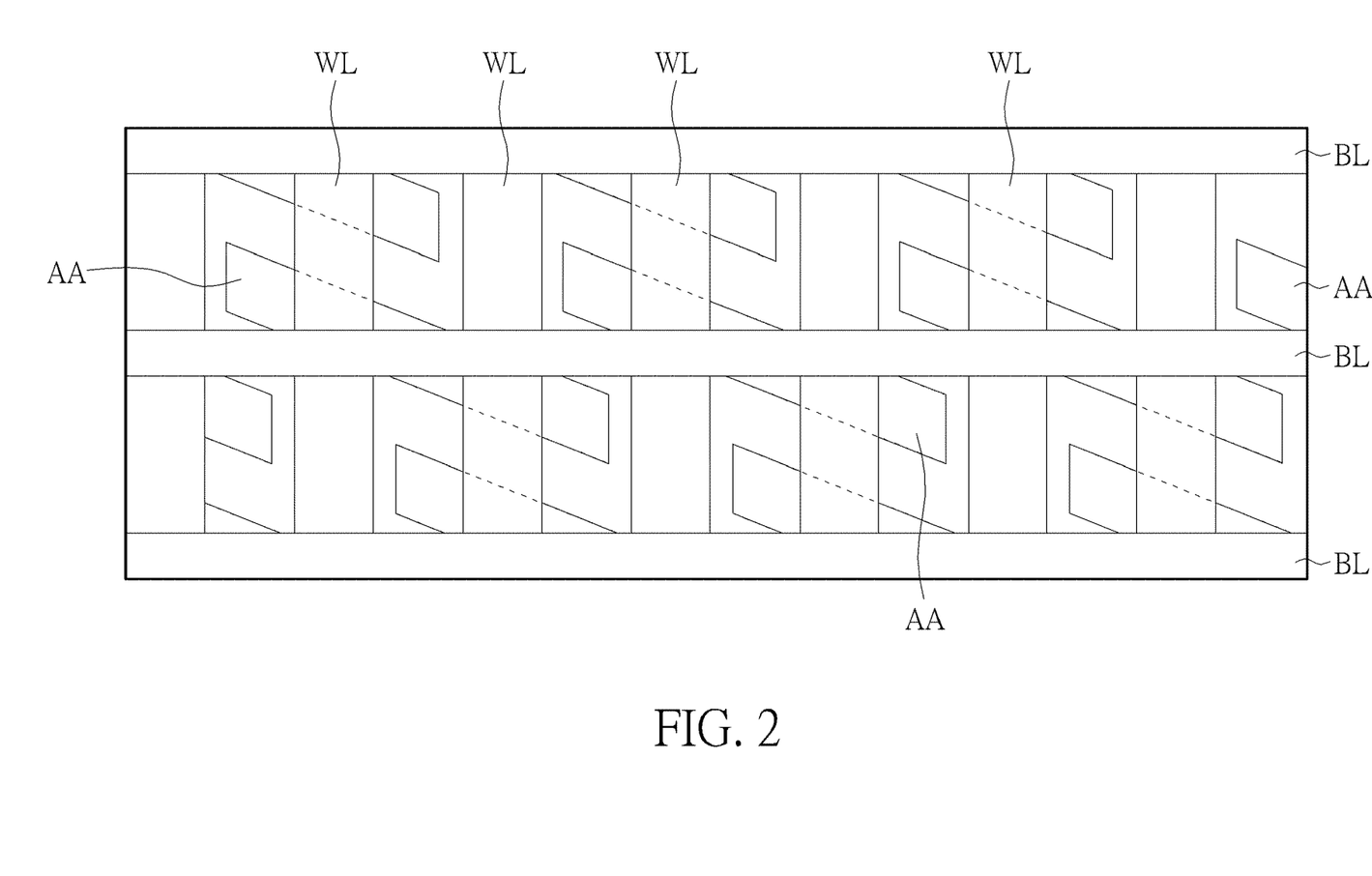
FIG. 2 is a partial enlarged schematic diagram of some sub-pattern units and active regions.
Figure 3:
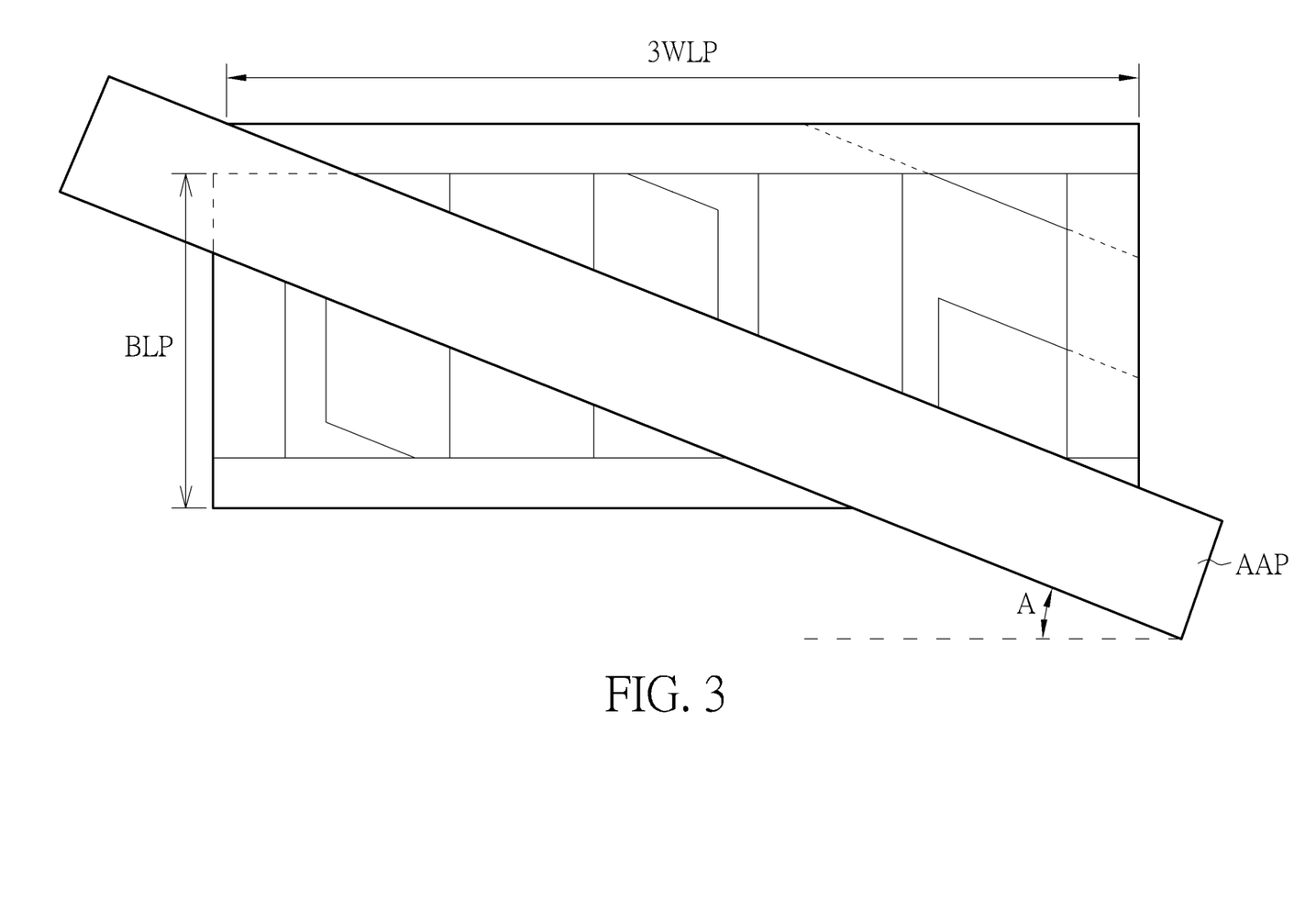
FIG. 3 shows the included angle A between the extending direction and the horizontal direction of the active region.

FIG. 2 shows a partial enlarged schematic diagram of part of the sub-pattern unit SP and the active area AA, and FIG. 3 shows the included angle a between the extending direction and the horizontal direction of the active area. In FIG. 2, a plurality of active areas AA are arranged along a first direction D1. In FIG. 3, it can be seen that in this embodiment, the extending direction of the active areas AA is designed to be parallel to the diagonal line of the dotted line frame, wherein each dotted line frame has a length of BLP and a width of 3WLP. In the active area AA, an active area pattern AAP is formed on a substrate first, and then etching and cutting steps are performed to form the active area AA in the substrate, so that the extending direction of the active area pattern AAP will be equal to that of the active area AA formed subsequently. In this embodiment, in order to achieve a preferable repetitive distribution effect, it can be designed that when the active area pattern AAP crosses one distance BLP in the vertical direction, it crosses three distances WLP in the horizontal direction. That is, as shown by the dashed lines in FIGS. 2 and 3, each active area pattern AAP is parallel to the diagonal direction of the dashed line. The angle between the extending direction of the active area pattern AAP (that is, the first direction D1) and the horizontal direction can be defined as A, and the angle A is equal to $\tan^{-1}(BLP/3*WLP)$. Taking this embodiment as an example, if BLP=62 nm; WLP=52 nm, the angle A is equal to about 21.67 degrees, but the present invention is not limited to this.

Figure 4:
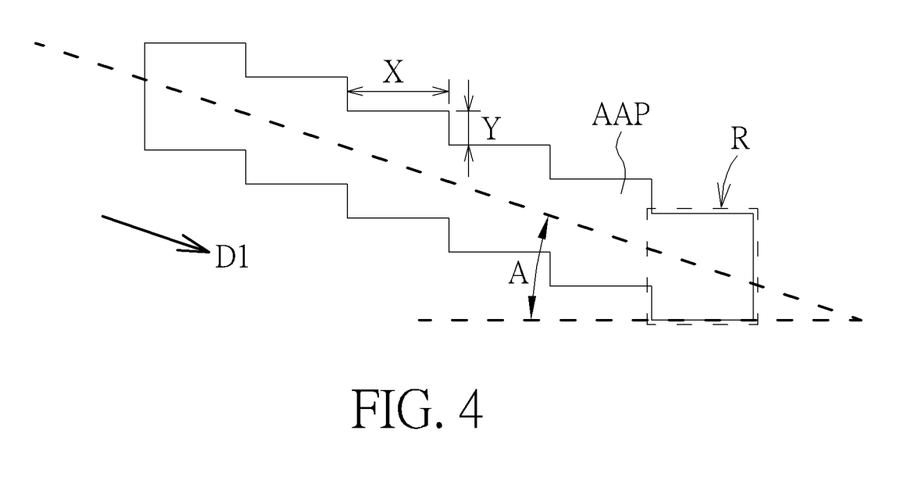
FIG. 4 is a schematic diagram of a stepped active area pattern.
Figure 5:
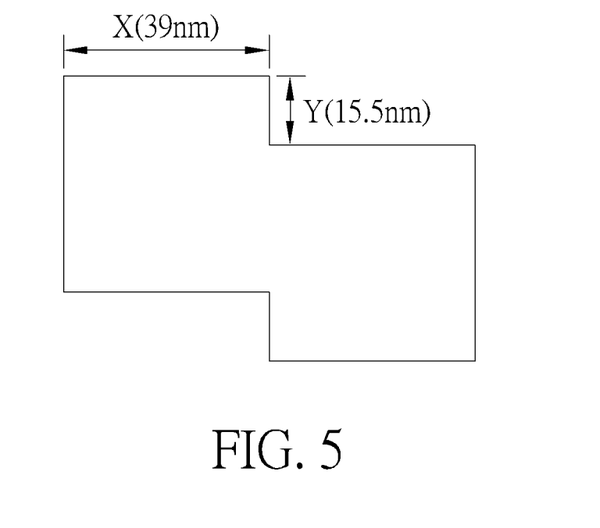
FIG. 5 shows an enlarged schematic diagram of a stepped active area pattern.

FIG. 4 is a schematic diagram of a stepped active area pattern, and FIG. 5 is a schematic diagram of an enlarged stepped active area pattern AAP. Please note that the step-like active area pattern AAP drawn from FIG. 4 and its adjustment steps may be related in the computer, and then the pattern will be output to the photomask, and then the photomask will be used as a mask to transfer the pattern to the substrate. As shown in FIG. 4 and FIG. 5, in the manufacturing process, the diagonally arranged active area patterns AAP are preferably composed of stepped patterns, wherein each stepped pattern includes a plurality of rectangular patterns R continuously arranged along the first direction D1, that is, the first direction D1 is formed by connecting the center points of each rectangular pattern R. In this embodiment, the width X is defined as the width of each rectangular pattern R in the horizontal direction, and the step difference Y is defined as the length of each rectangular pattern R that does not overlap with another adjacent rectangular pattern R in the vertical direction. As the angle a between the first direction and the horizontal direction has been defined as $\tan^{-1}(BLP/3*WLP)$, the ratio of width X to segment difference Y here also needs to meet this condition, that is, $\tan^{-1}(BLP/3*WLP)=\tan^{-1}(Y/X)$, or simplified as $BLP/3*WLP=Y/X$. The width X and the segment difference Y can be suitable values, but the width X and the segment difference Y are also limited by the critical dimension (CD) of the lithography process, so they cannot be infinitely reduced. In this embodiment, X=39 nm and Y=15.5 nm are selected.

Figure 6:
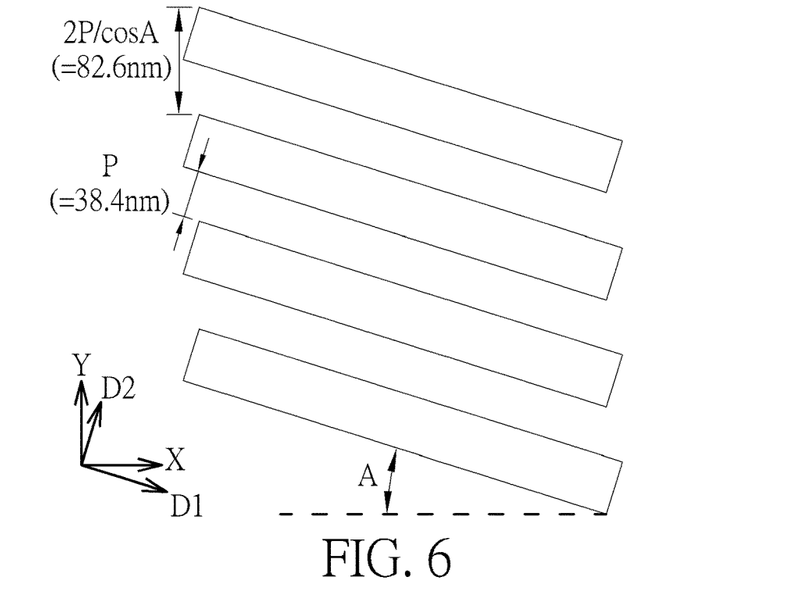
FIG. 6 is a schematic diagram showing the ideal arrangement of a plurality of active region patterns.

Starting from FIG. 6, in order to clearly indicate the numerical values of various distances (such as length, width and spacing) and angles, some numerical values will be directly shown on the figure. However, it can be understood that these values are only one example of this embodiment, and the present invention can adjust these values according to actual needs. FIG. 6 shows an ideal arrangement of a plurality of active area patterns AAP. In an ideal state, when a plurality of active area patterns AAP are arranged on a substrate, the distance between each active area pattern AAP should be equal. Setting the shortest distance between any active area pattern AAP and another adjacent active area pattern AAP along a second direction D2 as a distance P, wherein the second direction D2 is perpendicular to the first direction D1, where the distance P is, for example, 38.4 nm (this value is also affected by exposure extreme CD), and the included angle A between each active area pattern AAP and the horizontal direction is $\tan^{-1}(BLP/3*WLP)$, for example, 21.67 degrees. Therefore, it can be calculated that the distance from one upper edge of any active area pattern AAP to the upper edge of another adjacent active area pattern AAP along the vertical direction is 2P/cos A=2*38.4/cos 21.67 degrees=82.6 nm (this value is simply referred to as the upper edge distance).

Figure 7:
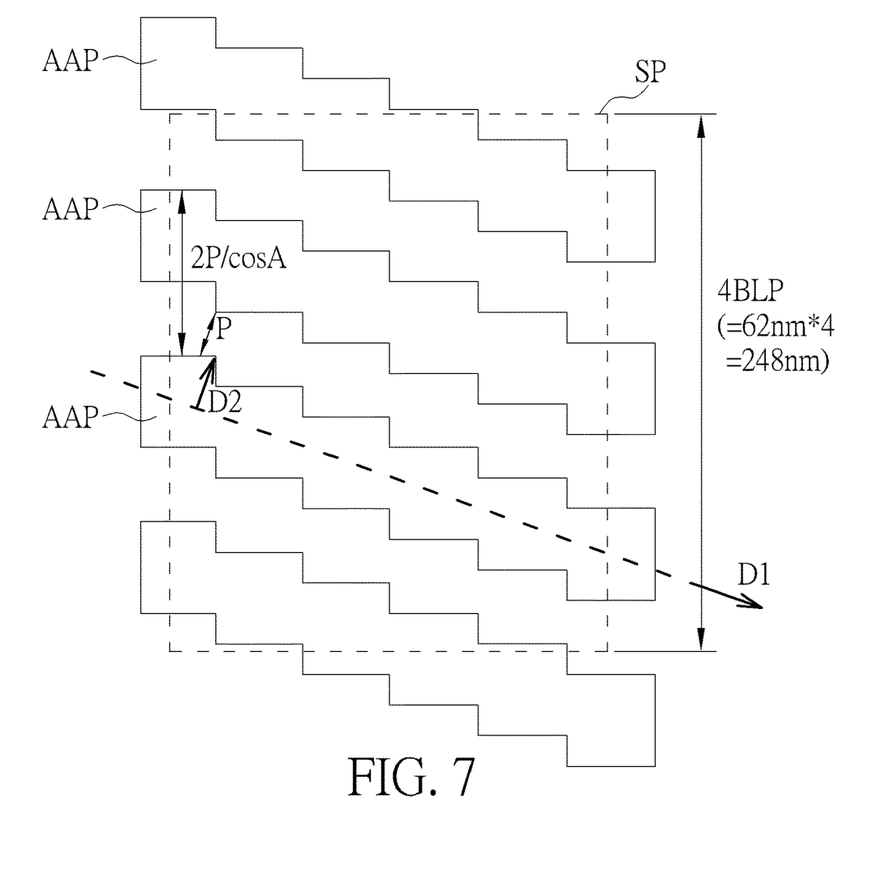
FIG. 7 is a schematic diagram showing the arrangement of a plurality of active area patterns within the area of sub-pattern units.
Figure 8:
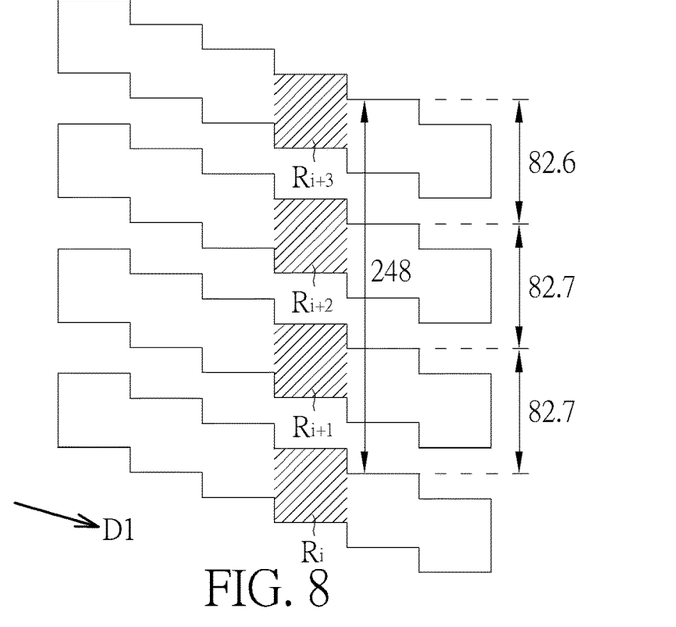
FIG. 8 is a schematic diagram showing the arrangement of a plurality of stepped active area patterns before correction within the area of a sub-pattern unit.

FIG. 7 is a schematic diagram showing the arrangement of a plurality of active area patterns AAP in the area of the sub-pattern unit SP, and FIG. 8 is a schematic diagram showing the arrangement of a plurality of stepped active area patterns AAP in the area of the sub-pattern unit SP before correction. As shown in FIG. 7, the length of the sub-pattern unit SP is 4BLP, and the integer part N obtained by dividing the length 4*BLP of the sub-pattern unit SP by 2P/cos A (the distance between the upper edges of adjacent active area patterns AAP) calculated above can calculate that N active area patterns AAP can be placed in the sub-pattern unit. In this embodiment, it is 248 nm/82.6 nm=3.0024. Taking the integer part N as 3 means that up to three active area patterns AAP (N=3) can be placed in the sub-pattern unit SP area.

However, as shown in FIG. 8, if the vertical length of 248 nm is evenly distributed to the three active area patterns AAP, the distance between the upper edges of some active area patterns AAP is 82.6 nm, while the distance between the upper edges of some active area patterns AAP is 82.7 nm. Although the difference is only 0.1 nm, when the sub-pattern units SP are repeatedly arranged on the substrate, the slight error of 0.1 nm will be enlarged continuously.

Figure 9:
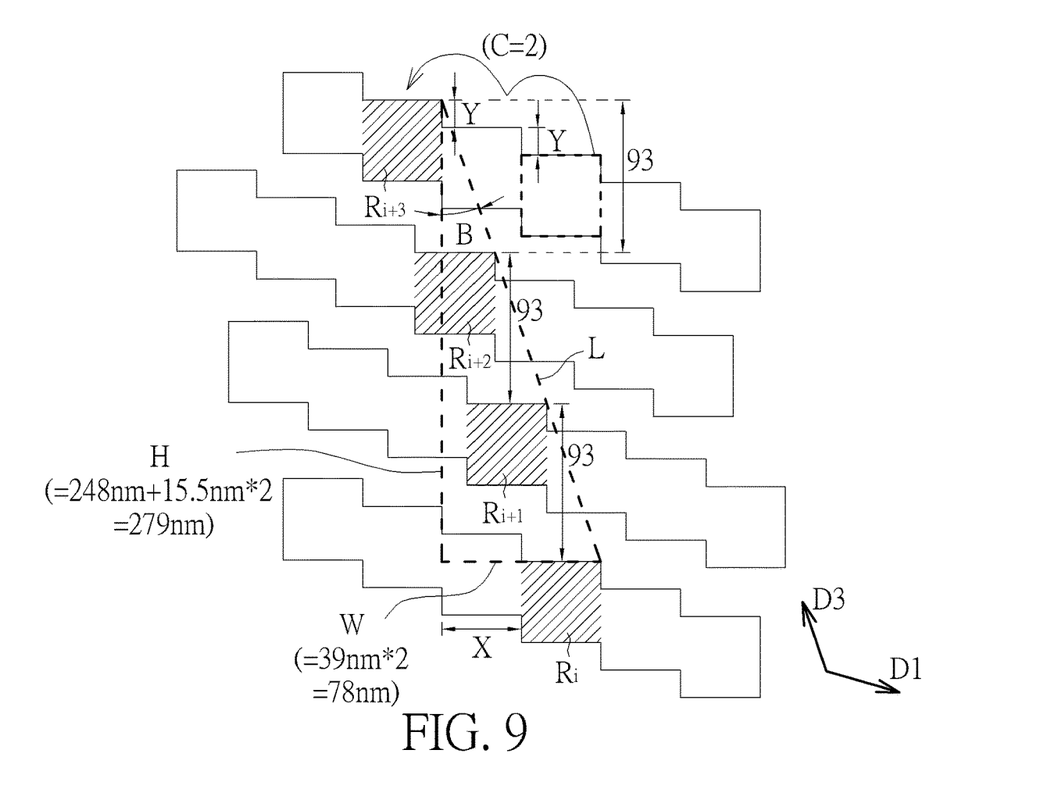
FIG. 9 is a schematic diagram showing the corrected arrangement of a plurality of stepped active area patterns within the area of sub-pattern units.

Therefore, in the present invention, after the active area patterns AAP are distributed in the sub-pattern units SP, an adjustment step is performed to make the distances between each active area pattern AAP and the upper edge of the adjacent active area pattern AAP being equal to each other. The method is shown in FIG. 8 and FIG. 9. Firstly, one rectangular pattern r of an active area pattern AAP is selected (indicated by diagonal lines in FIG. 8 and FIG. 9), and other adjacent rectangular patterns are also marked in the vertical direction, for example, they are respectively marked as rectangular patterns Ri, Ri+1, Ri+2, ri+3. In this embodiment, since only three active area patterns AAP can be placed in the sub-pattern unit SP at most, rectangular patterns Ri, Ri+1 and Ri+2 should be located in the same sub-pattern unit SP, while Ri+3 corresponds to N and repeats, and is located in another adjacent sub-pattern unit SP. The adjustment step of the present invention is to adjust the horizontal and vertical distances between Ri and Ri+1, Ri+2 and Ri+3 by using the value of the segment difference Y. In detail, in the present invention, the length 4BLP of the original sub-pattern unit SP is gradually added with the numerical value of the C-order step difference Y until the numerical value can be evenly divided by the number of active area patterns AAP in the sub-pattern unit SP (3 in this embodiment), that is, the condition of (4BLP+C*Y)/N=integer is met, where C is 0 or the smallest positive integer greater than or equal to 1, and where n is an integer.

In this embodiment, for example, 4BLP=248 nm; N=3; Y=15.5 nm:

If C=1, it is verified that (248+1*15.5)/3=87.83, which is not divisible, so C is not equal to 1, so it is necessary to continue testing C=2, 3, 4, 5 . . . until divisible, and find out the minimum value of C:

If C=2, verify that (248+2*15.5)/3=93 is divisible, so C is equal to 2.

After adding the step difference y twice to the rectangular pattern Ri+3, as shown in FIG. 9, FIG. 9 shows a schematic arrangement of a plurality of stepped active area patterns AAP after correction within the area of the sub-pattern unit SP. The vertical distance between the corrected rectangular pattern Ri+3 and the rectangular pattern Ri is defined as H, where H=4BLP+C*Y, and H in this embodiment is 248 nm+2*15.5 nm=279 nm; A horizontal distance between the corrected rectangular pattern Ri+3 and the rectangular pattern Ri is defined as W, where W=C*X, and W=2*39=78 nm in this embodiment. Therefore, an oblique line L can be drawn between the corrected rectangular pattern Ri+3 and the rectangular pattern Ri, wherein the oblique line L can extend along a third direction D3, which is different from the horizontal direction X or the vertical direction Y, that is, the included angle between the third direction D3 and the vertical direction is B, and the included angle B=$\tan^{-1}(C*X/4BLP+C*Y)$. The modified rectangular patterns Ri, Ri+1, Ri+2, etc. are arranged along the oblique line L. It can also be seen from FIG. 9 that the distances between the upper edges of the corrected multiple stepped active area patterns AAP are all the same (taking FIG. 9 as an example, they are all 93 nm). Therefore, the stepped active area pattern adjustment method provided by the present invention is helpful to make the pattern distribution more uniform and improve the process yield.

In addition, in this embodiment, because N=3, every three active area patterns AAP representing a plurality of steps are set as one group, and a plurality of groups of stepped active area patterns AAP are repeatedly arranged. That is, the rectangular pattern Ri is aligned with the rectangular pattern Ri+3.

It is worth noting that the values mentioned in the above embodiments, including WLP, BLP, X, Y, N, C, etc., may be adjusted according to actual needs. In some embodiments, if C=0, it means that no adjustment step is required.

To sum up the above, the present invention proposes a pattern layout, which comprises a plurality of first line segments (bit lines BL) arranged parallel to each other along a horizontal direction and a plurality of second line segments (word lines WL) arranged parallel to each other along a vertical direction, wherein the upper boundary edge of any first line segment to another adjacent first line segment is defined as BLP, and the left boundary edge of any second line segment to another adjacent second line segment is defined as WLP. The sub-pattern unit SP has a width of 4WLP and a length of 4BLP, and a plurality of oblique stepped patterns (active area patterns AAP), wherein each oblique stepped pattern comprises a plurality of rectangular patterns R which are connected with each other and arranged along a first direction D1, wherein a width of each rectangular pattern r in the horizontal direction is defined as X, and a distance of the part of each rectangular pattern which does not overlap with adjacent rectangular patterns in the vertical direction is defined as Y, and satisfy the following conditions: BLP/3WLP=Y/X, wherein N pieces of the oblique stepped patterns are located in the sub-pattern unit, and satisfy the conditions: (4BLP+C*Y)/N=integer, where C is 0 or the smallest positive integer greater than or equal to 1, and where N is an integer.

Optionally, the included angle between the first direction D1 and the horizontal direction (X-axis) is defined as A, and satisfies the condition that A=tan−1(BLP/3 WLP)=tan$^{-1}$(Y/X).

Optionally, along a second direction D2, the shortest distance between two adjacent oblique stepped patterns is defined as P, wherein the second direction D2 is perpendicular to the first direction D1.

Optionally, along the vertical direction, the distance from the upper boundary of any one of the oblique stepped patterns to the upper boundary of another adjacent oblique stepped pattern is 2P/cos A.

Optionally, where N is equal to the integer part of 4BLP/2P/cos A).

Optionally, the sub-pattern units include a first rectangular pattern Ri, a second rectangular pattern Ri+1 and a third rectangular pattern Ri+2, wherein the first rectangular pattern Ri, the second rectangular pattern Ri+1 and the third rectangular pattern Ri+2 are respectively located in three different and mutually adjacent inclined ladder-shaped patterns AAP, and the first rectangular pattern Ri, the second rectangular pattern Ri+1 and the third rectangular pattern Ri+2 are aligned along a third direction D3.

Optionally, an included angle between the third direction D3 and the vertical direction (Y-axis) is defined as b, which satisfies the condition: B=tan−1(C*X/4BLP+C*Y).

Optionally, the first direction D1 is different from the horizontal direction (X axis) or the vertical direction (Y axis).

Optionally, in the sub-pattern unit SP, in the vertical direction (Y-axis), the distances from an upper boundary of any oblique stepped pattern (active area pattern AAP) to an upper boundary of another adjacent oblique stepped pattern (active area pattern AAP) are equal to each other.

The forming method of pattern layout includes inputting the pattern layout into a computer system, wherein the pattern layout comprising a plurality of first line segments arranged parallel to each other along a horizontal direction and a plurality of second line segments arranged parallel to each other along a vertical direction, wherein the distance from an upper boundary edge of any one of the first line segment to an upper boundary edge of another adjacent first line segment is defined as BLP, and the distance edge from a left boundary edge of any one of the second line segment to a left boundary of another adjacent second line segment is defined as WLP, defining a sub-pattern unit, wherein the width of the sub-pattern unit is 4*WLP and the length is 4*BLP, performing a correction step through the computer system to form a plurality of oblique stepped patterns, wherein each oblique stepped pattern comprises a plurality of rectangular patterns with the same shape which are repeatedly connected with each other and arranged along a first direction, wherein a width of each rectangular pattern in the horizontal direction is defined as X, and a distance of the part of each rectangular pattern which does not overlap with an adjacent rectangular pattern in the vertical direction is defined as Y, and the following conditions are satisfied: BLP/3WLP=Y/X, wherein a total of N oblique stepped patterns are located in the sub-pattern unit, and satisfy the condition that (4BLP+C*Y)/N=integer, where C is 0 or the smallest positive integer greater than or equal to 1, and N is an integer.

Optionally, the included angle between the first direction D1 and the horizontal direction (x-axis) is defined as A, and satisfies the condition that A=tan$^{-1}$(BLP/3WLP)=tan$^{-1}$(Y/X).

Optionally, along a second direction D2, the shortest distance between two adjacent oblique stepped patterns is defined as P, wherein the second direction D2 is perpendicular to the first direction D1.

Optionally, along the vertical direction, the distance between the upper boundary of any one of the oblique stepped patterns (active area pattern AAP) and the upper boundary of another adjacent oblique stepped pattern (active area pattern AAP) is 2P/cos A.

Optionally, where N is equal to the integer part of 4BLP/2P/cos A).

Optionally, the step of forming the plurality of oblique stepped patterns (active area patterns AAP) includes defining the positions of a plurality of initial oblique stepped patterns by the computer system (active area patterns AAP) (as shown in FIG. 8) and forming and adjusting the positions of part of the initial oblique stepped patterns to form a plurality of oblique stepped patterns by the computer system (as shown in FIG. 9).

Optionally, in the sub-pattern unit, the plurality of initial oblique stepped patterns include a first rectangular pattern, a second rectangular pattern and a third rectangular pattern, wherein the first rectangular pattern, the second rectangular pattern and the third rectangular pattern are formed by the computer system, and wherein the first rectangular pattern, the second rectangular pattern and the third rectangular pattern are respectively located in three different and mutually adjacent initial oblique stepped patterns, and the first rectangular pattern, the second rectangular pattern and the third rectangular pattern are similar to each other.

Optionally, after adjusting the positions of some of the initial oblique stepped patterns to form the plurality of oblique stepped patterns by the computer system, the first rectangular pattern, the second rectangular pattern and the third rectangular pattern are aligned along a third direction within the sub-pattern unit.

Optionally, an included angle between the third direction D3 and the vertical direction is defined as B, which satisfies the condition: B=tan$^{-1}$(C*X/4BLP+C*Y).

Optionally, the first direction D1 is different from the horizontal direction or the vertical direction.

Optionally, in the sub-pattern unit SP, in the vertical direction, the distances from each upper boundary of any oblique stepped pattern (active area pattern AAP) to the upper boundary of another adjacent oblique stepped pattern (active area pattern AAP) are equal to each other.

The invention provides a pattern layout, which is characterized by comprising a plurality of oblique stepped patterns (active area patterns AAP) arranged in parallel with each other, wherein each oblique stepped pattern is formed by repeatedly arranging a plurality of rectangular patterns R, wherein each oblique stepped pattern comprises a plurality of rectangular patterns R connected with each other and arranged along a first direction D1, wherein a width of each rectangular pattern R in a horizontal direction is defined as X, and a distance of the part of each rectangular pattern which does not overlap with an adjacent rectangular pattern in the vertical direction is defined as Y, wherein Y is not equal to 0.

Optionally, two adjacent oblique stepped patterns are defined as Ri and Ri+1 respectively, wherein a right boundary of a rectangular pattern of oblique stepped pattern Ri and a right boundary of a rectangular pattern of oblique stepped pattern Ri+1 are not aligned with each other in a vertical direction.

Optionally, there are four oblique stepped patterns, which are defined as Ri, Ri+1, Ri+2 and Ri+3 in sequence according to the arrangement order, wherein a right boundary of a rectangular pattern of the oblique stepped pattern Ri is not aligned with a right boundary of a rectangular pattern of the oblique stepped pattern Ri+2 or the oblique stepped pattern Ri+3 in a vertical direction.

The feature of the present invention is that in the sub-pattern unit, an appropriate active area pattern is designed according to the bit line pitch (BLP) and the word line pitch (WLP), wherein the active area pattern is a stepped pattern formed by connecting a plurality of rectangular patterns in series, and the active area pattern is arranged along a first direction, wherein the angle between the first direction and the horizontal direction is A. In addition, according to the angle A, the shortest distance (P) between adjacent stepped patterns, the length and width of sub-pattern units, etc., The positions of some stepped active area patterns are adjusted, so that the distance between multiple active area patterns can be consistent when being repeatedly arranged, thereby improving the uniformity of overall pattern distribution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pattern layout, at least comprising:
   a plurality of first line segments parallel to each other and arranged separately along a horizontal direction and a plurality of second line segments parallel to each other and arranged separately along a vertical direction, wherein the distance between an upper boundary edge of any first line segment and an upper boundary edge of another adjacent first line segment is defined as BLP, and the distance between a left boundary edge of any second line segment and a left boundary edge of another adjacent second line segment is defined as WLP;
   a sub-pattern unit with a width of 4*WLP and a length of 4*BLP;
   a plurality of oblique stepped patterns, wherein each oblique stepped pattern comprises a plurality of rectangular patterns with the same shape which are repeatedly connected with each other and arranged along a first direction, wherein a width of each rectangular pattern in the horizontal direction is defined as X, and a length of the part of each rectangular pattern which does not overlap with an adjacent rectangular pattern in the vertical direction is defined as Y, and the following conditions are satisfied: BLP/3WLP=Y/X; a total of N oblique stepped patterns are located in the sub-pattern unit, and satisfy the condition that (4BLP+C*Y)/N=integer, where C is the smallest positive integer greater than or equal to 1, and where N is an integer;
   wherein the sub-pattern unit includes a first rectangular pattern, a second rectangular pattern and a third rectangular pattern, wherein the first rectangular pattern, the second rectangular pattern and the third rectangular pattern are respectively located in three different and mutually adjacent oblique stepped patterns, and the first rectangular pattern, the second rectangular pattern and the third rectangular pattern are along a third direction, and wherein an included angle between the third direction and the vertical direction is defined as B, and satisfies the condition that $B=\tan^{-1}(C*X/4BLP+C*Y)$.

2. The pattern layout according to claim 1, wherein the first direction is a direction formed by connecting center points of each rectangular pattern, and wherein an included angle between the first direction and the horizontal direction is defined as A, and satisfies the condition that $A=\tan^{-1}(BLP/3WLP)=\tan^{-1}(Y/X)$.

3. The pattern layout according to claim 2, wherein the shortest distance between two adjacent oblique stepped patterns along a second direction is defined as P, wherein the second direction is perpendicular to the first direction, and, wherein along the vertical direction, the distance from the upper boundary of any one of the oblique stepped patterns to the upper boundary of another adjacent oblique stepped pattern is 2P/cos A.

4. The pattern layout according to claim 3, wherein N is equal to the integer part of 4BLP/(2P/cos A).

5. The pattern layout according to claim 1, wherein in the sub-pattern unit, the distances from an upper boundary of any one of the oblique stepped pattern to an upper boundary of another adjacent oblique stepped pattern are equal to each other along the vertical direction.

6. A pattern layout, comprising:
   a plurality of oblique stepped patterns arranged in parallel with each other, wherein each oblique stepped pattern is formed by repeatedly arranging a plurality of rectangular patterns with the same size, wherein the plurality of rectangular patterns with the same size which are connected with each other and arranged along a first direction, wherein a width of each rectangular pattern of the plurality of rectangular patterns with the same size in a horizontal direction is defined as X, and a distance of the part of each rectangular pattern which does not overlap with an adjacent rectangular pattern in a vertical direction is defined as Y, wherein Y is not equal to 0; and
   wherein two adjacent oblique stepped patterns are defined as Ri and Ri+1, respectively, and a right boundary of a rectangular pattern of the oblique stepped pattern Ri and a right boundary of a rectangular pattern of the oblique stepped pattern Ri+1 are not aligned with each other in the vertical direction, the rectangular pattern of the oblique stepped pattern Ri and the rectangular pattern of the oblique stepped pattern Ri+1 partially overlap each other in the vertical direction.

7. The pattern layout according to claim 6, wherein the pattern layout comprises four oblique stepped patterns, the four oblique stepped patterns are defined as Ri, Ri+1, Ri+2 and Ri+3 in sequence according to the arrangement order, wherein a right boundary of a rectangular pattern of the oblique stepped pattern Ri is aligned with a right boundary of a rectangular pattern of the oblique stepped pattern Ri+2 or the oblique stepped pattern Ri+3 in the vertical direction.

8. The pattern layout according to claim 6, wherein the first direction is a direction formed by connecting the center points of each rectangular pattern.

* * * * *